United States Patent
Hilburn et al.

(10) Patent No.: US 9,310,413 B2
(45) Date of Patent: *Apr. 12, 2016

(54) MONITORING POWER SOURCE REDUNDANCY VIA A POWER DISTRIBUTION UNIT

(71) Applicant: International Business Machines Corporation, Armonk, NY (US)

(72) Inventors: John C. Hilburn, Austin, TX (US); Jeffrey J. Smith, Raleigh, NC (US); Marshall S. Stanley, Chapel Hill, NC (US); David T. Windell, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/608,517

(22) Filed: Jan. 29, 2015

(65) Prior Publication Data

US 2015/0137608 A1 May 21, 2015

Related U.S. Application Data

(63) Continuation of application No. 13/372,539, filed on Feb. 14, 2012, now Pat. No. 8,972,753.

(51) Int. Cl.
*G06F 1/00* (2006.01)
*G01R 31/02* (2006.01)
(Continued)

(52) U.S. Cl.
CPC .............. *G01R 31/023* (2013.01); *G01R 21/00* (2013.01); *G06F 1/189* (2013.01); *G06F 1/26* (2013.01); *G06F 1/3203* (2013.01); *H02J 3/00* (2013.01); *H05K 7/1492* (2013.01); *G06F 1/3296* (2013.01); *Y10T 307/696* (2015.04); *Y10T 307/766* (2015.04)

(58) Field of Classification Search
CPC ....... G06F 1/3203; G06F 1/26; G06F 1/3296; Y02B 60/1217
See application file for complete search history.

(56) References Cited

U.S. PATENT DOCUMENTS 4,734,638 A 3/1988 Weber
5,570,002 A 10/1996 Castleman
(Continued)

FOREIGN PATENT DOCUMENTS

CN 102298436 A 12/2011
WO 2008113052 A1 9/2008

OTHER PUBLICATIONS

Dell PowerEdge T610 Systems Hardware Owner's Manual. [online] Accessed: Jul. 2011. Accessed on: <URL: http://support.dell.com/support/edocs/systems/pet61 O/en/hom/htm l/about.him>.
(Continued)

*Primary Examiner* — Thomas Lee
*Assistant Examiner* — Lin Lin Htay
(74) *Attorney, Agent, or Firm* — Stephen R. Yoder (57) ABSTRACT

A programmable logic circuit assigns a value to an outlet of a power distribution unit (PDU) that comprises a power source at an input of the PDU and at least one light-emitting diode (LED) associated with the outlet. The programmable logic circuit sends the value to a program on a hardware device that comprises one or more power supplies. The programmable logic circuit receives information from the program. Subsequently, an illumination state of the LED is modified based on the information.

3 Claims, 5 Drawing Sheets (51) Int. Cl.

| | |
|---|---|
| *G06F 1/18* | (2006.01) |
| *H05K 7/14* | (2006.01) |
| *G06F 1/26* | (2006.01) |
| *G06F 1/32* | (2006.01) |
| *G01R 21/00* | (2006.01) |
| *H02J 3/00* | (2006.01) |

(56) References Cited

U.S. PATENT DOCUMENTS

| | | | | |
|---|---|---|---|---|
| 5,572,685 | A | | 11/1996 | Fisher et al. |
| 5,818,673 | A | | 10/1998 | Matsumaru et al. |
| 6,297,724 | B1 | | 10/2001 | Bryans et al. |
| 6,747,369 | B2 | | 6/2004 | Griffith et al. |
| 7,919,976 | B2 | | 4/2011 | Ball |
| 7,934,124 | B2 | | 4/2011 | Bechtolsheim et al. |
| 8,674,823 | B1 | * | 3/2014 | Contario et al. .......... H02J 1/10 340/333 |
| 2003/0126253 | A1 | | 7/2003 | Ewing et al. |
| 2010/0066171 | A1 | | 3/2010 | Thakur et al. |
| 2011/0131455 | A1 | | 6/2011 | Law et al. |
| 2011/0149526 | A1 | | 6/2011 | Turner |
| 2012/0181869 | A1 | * | 7/2012 | Chapel et al. ............. H02J 9/06 307/64 |

OTHER PUBLICATIONS

Dell PowerEdge R710 Systems Hardware Owner's Manual. [online] Accessed: Jul. 2011. Accessed on: <URL: http://support. dell.com/support/edocs/systems/per 71O/en/hom/pdf/horn. pdf>.

Elnozahy et al. "Energy-Efficient Server Clusters". [online] Accessed on: Oct. 27, 2011. <URL: http://citeseer.isl.psu.edu/viewdoc/summary?doi=10.1.1.19.6123>. IBM Research, Austin TX, USA.

Hughes et al. "BladeCenter processor blades, 1/0 expansion adapters, and units". IBM Journal of Research and Development. vol. 49. No. 6. Nov. 2005. pp. 837-859. IBM.

IBM. "A Method of Visual Partitioning Cable Identification and Diagnostics (Cable Lightpalh)". IP.com Prior Art Database. IP.com No. IPCOM000126976D. Publication dale: Aug. 16, 2005. [online] <URL: www.ip.com>.

IBM. "Method to Communicate Cable Activity and Device State Through Cable Color/lighting". IP.com Prior Art Database. IP.com No. IPCOM000176236D Publication dale: Nov. 10, 2008. [online] <URL: www.ip.com>.

Junos Internet Software Network Operations Guide: Hardware. Chapter 38: Monitoring Redundant Power Supplies. pp. 507-522. [online] Accessed on Nov. 3, 2011. <URL: http://www.juniper.net!techpubs/software/nog/nog-hardware/lopframe.hlm>.

Wang. "Coordinating Power Control and Performance Management for Virtualized Server Clusters". IEEE Transactions on Parallel and Distributed Systems. vol. 22, No. 2. Feb. 2011. pp. 245-259. IEEE.

U.S. Appl. No. 13/372,539, entitled "Monitoring Power Source Redundancy Via a Power Distribution Unit", filed Feb. 14, 2012.

China Patent Application 201310051642.X, titled "Monitoring Power Source Redundancy Via a Power Distribution Unit", Filed Feb. 8, 2013.

* cited by examiner

MONITORING POWER SOURCE REDUNDANCY VIA A POWER DISTRIBUTION UNIT

BACKGROUND

1. Field of the Invention

This disclosure relates generally to power distribution units, and more specifically to monitoring power source redundancy via a power distribution unit.

2. Description of the Related Art

Complex computer environments such as data centers contain multiple hardware devices, for example server computers, computer storage devices, and computer network equipment. The hardware devices have a variety of power needs and can be housed within a computer rack. To support the power needs of the hardware devices, power distribution units (PDUs) are utilized. The PDUs have multiple outlets (i.e., receptacles) that receive electrical power from a power source, and the outlets distribute the electrical power to the hardware devices via power cables that connect the outlets to power supplies of the hardware devices.

A service maintenance technician may experience difficulty in determining the location of a specific power cable that connects a power supply of a hardware device to an outlet of a PDU, because the power cable can be bundled together and covered by other power cables. For instance, often times within the complex computer environments, maintenance needs to be performed by a service maintenance technician on the hardware devices. To perform the maintenance, it may be necessary to disconnect one or more power cables of hardware devices, from outlets of PDUs in order to remove electrical power that is being supplied to the hardware devices. If the hardware devices are housed within a computer rack, for example a forty-two unit computer rack in which each unit has two power supplies, then there can be as many as eighty-four power cables running to multiple PDUs. Thus, if certain hardware devices have more than one power supply, then multiple power cables may have to be disconnected from the PDUs in order to ensure removal of electrical power to those hardware devices. Often the wrong power cables can be disconnected from the PDUs when trying to remove the electrical power to a hardware device, which can result in an unintentional shutdown of another hardware device that is operational and needs to remain on.

It is known for a person to physically trace the power cables that need to be disconnected, in order to locate the correct power cables and remove electrical power supplied to a specific hardware device. However, the power cables may be bundled together. As a result, a person may have to unbundle many power cables in order to physically trace certain power cables and remove the electrical power, which can be inefficient and increase the time to perform and complete maintenance tasks. Furthermore, it is also known to physically label each end of the power cables with handwritten or typewritten tags, which can assist with locating the correct power cables to disconnect from a PDU. However, trying to physically trace power cables and read tags on the power cables can be difficult because the power cables are often bundled together and housed within a tightly enclosed area that is not easily accessible to a person, such as a service maintenance technician.

SUMMARY

Aspects of an embodiment of the present invention disclose a method and program product for determining a power cable is suitable for disconnection from an outlet of a power distribution unit. A programmable logic circuit assigns a value to an outlet of a power distribution unit (PDU) that comprises a power source at an input of the PDU and at least one light-emitting diode (LED) associated with the outlet. The programmable logic circuit sends the value to a program on a hardware device that comprises one or more power supplies. The programmable logic circuit receives information from the program. Subsequently, an illumination state of the LED is modified based on the information.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

DETAILED DESCRIPTION

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like, conventional procedural programming languages such as the "C" programming language, a hardware description language such as Verilog, or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete, and will fully convey the scope of this disclosure to those skilled in the art. In the description, details of well-known features and techniques may be omitted to avoid unnecessarily obscuring the presented embodiments.

Embodiments of the present invention provide a technique for determining a power cable is suitable for disconnection from an outlet of a power distribution unit (PDU). The PDU includes a programmable logic circuit that modifies an illumination state of a light-emitting diode (LED) that is dedicated to a specific outlet of the PDU, based on information about power supplies and power source conditions. Particularly, the programmable logic circuit modifies the illumination state of the LED by activating, deactivating, or blinking the LED. The PDU having the programmable logic circuit and outlets with LEDs, can help a person determine power cables, of hardware devices, that are suitable for disconnection from outlets of the PDU.

If a hardware device is powered on, then the hardware device has one or more hardware power supplies that are functional. Power cables connected to the power supplies that are functional are not suitable for disconnection from an outlet of the PDU if the hardware device is powered on, because disconnecting the power cables may cause the hardware device to shutdown or lose power source redundancy. A hardware device has power source redundancy if the hardware device connects to at least two separate outlets that each distribute electrical power from a different power source.

Moreover, if the hardware device is powered on and has one or more non-functional power supplies, then power cables connected to the non-functional power supplies are suitable for disconnection from outlets of the PDU. Power cables are also suitable for disconnection from outlets of the PDU if the power cables are connected to power supplies of a hardware device that is powered off. Thus, power cables are suitable for disconnection if the hardware device is not utilizing the power cables as a transmission medium for receiving electrical power. Accordingly, if a hardware device is powered off, or the hardware device is powered on and has one or more power supplies that are non-functional, then LEDs corresponding to certain outlets connected to the hardware device will deactivate (i.e., certain LEDs will turn off). Particularly an LED corresponding to an outlet will deactivate if the outlet is connected, via a power cable, to a hardware device that is powered off. In addition, an LED corresponding to an outlet will deactivate if the outlet is connected via a power cable to a power supply, of a hardware device, that is non-functional. An LED that is deactivated indicates that it is safe to disconnect a power cable from an outlet corresponding to the LED.

Furthermore, certain power cables of hardware devices are not suitable for disconnection if the hardware devices are powered on, even if the hardware devices have power source redundancy. As described above, a hardware device has power source redundancy if the hardware device connects to at least two separate outlets that each distribute electrical power from a different power source. If the hardware device is powered on and has power source redundancy, then LEDs corresponding to outlets connected to functional power supplies of the hardware device will activate (i.e., LEDs will turn on). An LED that is activated indicates that it is unsafe to disconnect a power cable from an outlet corresponding to the LED, because disconnecting the power cable may lead to loss of power source redundancy for a hardware device.

In addition, if a hardware device is powered on and does not have power source redundancy, then LEDs corresponding to the outlets connected to functional power supplies of the hardware device will blink. A LED that blinks indicates that it is unsafe to disconnect a power cable from an outlet corresponding to the LED, because a hardware device connected to the outlet does not have power source redundancy and disconnecting the power cable may lead to total loss of electrical power to the hardware device.

Figure 1A:
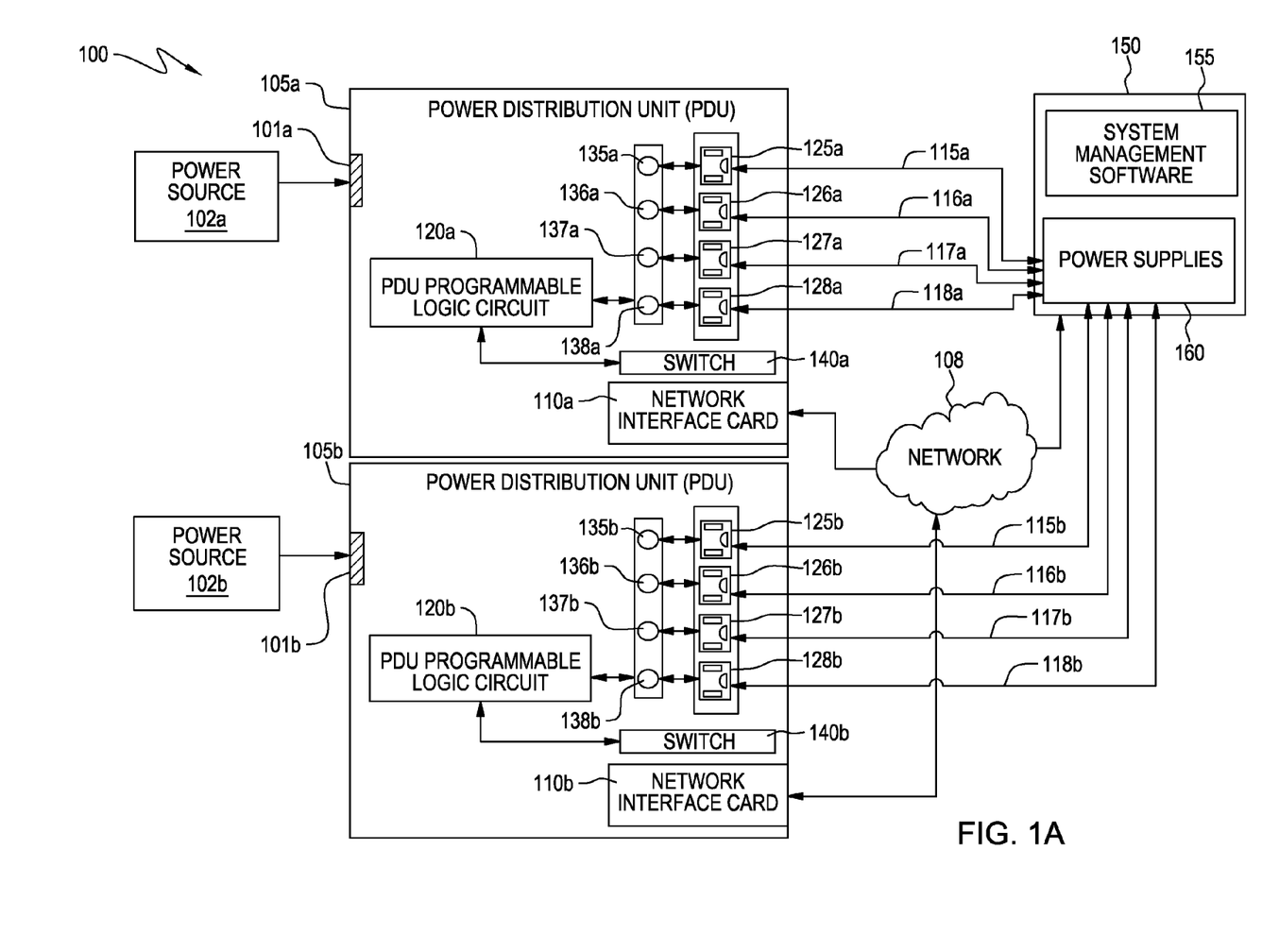
FIG. 1A is a block diagram of a system having programmable logic circuit that modifies an illumination state of light-emitting diodes (LEDs) that are dedicated to specific outlets of a power distribution unit (PDU) in which each PDU has a single power source according to an embodiment of the present invention.

FIG. 1A is a block diagram illustrating system 100 that includes PDU 105a and 105b having input 101a and 101b, power source 102a and 102b, network interface card 110a and 110b, power cables 115a-118a and 115b-118b, programmable logic circuit 120a and 120b, a group of outlets 125a-128a and 125b-128b, a group of LEDs 135a-138a and 135b-138b, and switch 140a and 140b, respectively. System 100 also includes one or more hardware devices 150 each having system management software 155 and one or more power supplies 160, wherein hardware devices 150 are connected to PDU 105a and 105b via network 108. Specifically, PDU 105a and 105b, utilizing network interface cards 110a and 110b, can be configured to communicate with system management software 155 via network 108. Network interface cards 110a and 110b include application firmware and hardware components that enable PDU 105a and PDU 105b respectively, to electronically communicate with hardware devices 150 (i.e., send and receive information). PDU 105a and 105b can be floor-mounted or housed within a computer rack. Moreover, outlets 125a-128a of PDU 105a are connected to LEDs 135a-138a respectively, and outlets 125b-128b of PDU 105b are connected to LEDs 135b-138b respectively. Power cables 115a-118a distribute electrical power from PDU 105a to hardware devices 150, and power cables 115b-118b distribute electrical power from PDU 105b to hardware devices 150. Particularly, power cables 115a-118a and 115b-118 can connect outlets 125a-128a and 125b-128b to as many as eight separate power supplies 160.

In the disclosed embodiment, PDU 105a and 105b both distribute electrical power to hardware devices 150, but are connected to different power sources. PDU 105a is connected to power source 102a at input 101a, whereas PDU 105b is connected to power source 102b at input 101b. Thus, in the disclosed embodiment, each of hardware devices 150 can have power source redundancy if at least one of its power supplies 160 that is functional is connected to PDU 105a, and if another one of its power supplies 160 that is functional is connected to PDU 105b. Hardware devices 150 may be a computer with a workload (i.e., an application program executing in the computer and generally a number of end-users interacting with the computer's applications) deployed to accomplish a specific task within a virtualized infrastructure in which essential resources such as processing power, storage, and network bandwidth can be dynamically allocated as needed.

Furthermore, in regard to PDU 105a, switch 140a can communicate with programmable logic circuit 120a to indicate which of outlets 125a-128a are connected to power source 102a, by selecting a value that can be assigned by programmable logic circuit 120a for each of outlets 125a-128a. Specifically, switch 140a can be a dual-in-line package (DIP) switch having selectors that can be toggled to select a first value that can be assigned to each of outlets 125a-128a, wherein the first value represents power source 102a. In the disclosed embodiment, power source 102a distributes electrical power through input 101a to all outlets 125a-128a. Thus, by utilizing switch 140a and programmable logic circuit 120a, each of outlets 125a-128a has the first value assigned to indicate that outlets 125a-128a are connected to power source 102a. As described above, PDU 105a is connected, via network 108, to hardware devices 150. Programmable logic circuit 120a utilizes network 108 to transmit, for each of outlets 125a-128a, the first value and a PDU outlet identifier (PDU outlet ID) to system management software 155. Each of outlets 125a-128a has a unique PDU outlet ID, which allows each outlet 125a-128a to be individually identified. System management software 155 can utilize the first value received for each of outlets 125a-128a as part of determining whether hardware devices 150 have power source redundancy (i.e., whether hardware devices 150 are redundantly cabled to power sources 102a and 102b). For example, if power supplies 160 are functional and are all connected to a combination of outlets 125a-128a having the first value (i.e., having the same power source), then system management software 155 determines that the hardware devices 150 corresponding to the power supplies 160 do not have power source redundancy because the hardware devices 150 are connected to a combination of outlets 125a-128a that have the same power source.

Likewise, in regard to PDU 105b, switch 140b can communicate with programmable logic circuit 120b to indicate which of outlets 125b-128b are connected to power source 102b, by selecting a value that can be assigned by programmable logic circuit 120b for each of outlets 125b-128b. In particular, switch 140b can be a DIP switch having selectors that can be toggled to select a second value that can be assigned to each of outlets 125b-128b, wherein the second value represents power source 102b. In the disclosed embodiment, power source 102b distributes electrical power through input 101b to all outlets 125b-128b. Thus, by utilizing switch 140b and programmable logic circuit 120b, each of outlets 125b-128b has the second value assigned to indicate that outlets 125b-128b are connected to power source 102b. For each of outlets 125b-128b, programmable logic circuit 120b transmits the second value and a PDU outlet ID, via network 108, to system management software 155. Each of outlets 125b-128b has a unique PDU outlet ID, which allows each outlet 125b-128b to be individually identified.

Subsequently, system management software 155 can process the first values, the second values, and PDU outlet IDs received and determine whether hardware devices 150 have power source redundancy. For example, if system management software 155 of a hardware device 150 receives a first value and a second value, then this indicates that the hardware device 150 is connected to a combination of outlets 125a-128a and 125b-128b having different power sources. Thus, if the hardware device 150 has power supplies 160 that are functional and connected to the combination of outlets 125a-128a and 125b-128b having different power sources, then system management software 155 processes the first value and second value and determines that the hardware device 150 has power source redundancy. However, if the system management software 155 of a hardware device 150 receives only one or more first values or only one or more second values, then this indicates that the hardware device 150 is connected to a combination of outlets 125a-128a or 125b-128b not having different power sources. Consequently, system management software 155 processes the one or more first values or second values and determines that the hardware device 150 does not have power source redundancy.

After making a determination on power source redundancy, of hardware devices 150, system management software 155 can send information about power supplies 160 and power source conditions to programmable logic circuit 120a and 120b. Specifically, the information that system management software 155 can send to programmable logic circuit 120a and 120b includes the following: outlets 125a-128a and 125b-128b that are connected to hardware devices 150 via power supplies 160, whether hardware devices 150 are powered on, whether hardware devices 150 are powered off, whether hardware devices 150 are receiving electrical power via power supplies 160 from at least two different power sources, outlets 125a-128a and 125b-128b that are connected to power supplies 160 that are non-functional, and outlets 125a-128a and 125b-128b that are connected to power supplies 160 that are functional.

As mentioned above, programmable logic circuit 120a and 120b receive the information from system management software 155. Programmable logic circuit 120a and 120b can utilize the information to activate, deactivate, or blink one or more LEDs 135a-138a and 135b-138b, respectively. Programmable logic circuit 120a and 120b may be implemented utilizing a microprocessor or an integrated circuit such as a field-programmable gate array (FPGA), which can be programmed by an end-user. In addition, in the disclosed embodiment, PDU 105a and 105b each have four outlets 125a-128a and 125b-128b, respectively. In other embodiments (not shown) PDU 105a and 105b may each have only one outlet or as many as forty outlets, wherein each outlet can have its own corresponding LED.

Figure 1B:
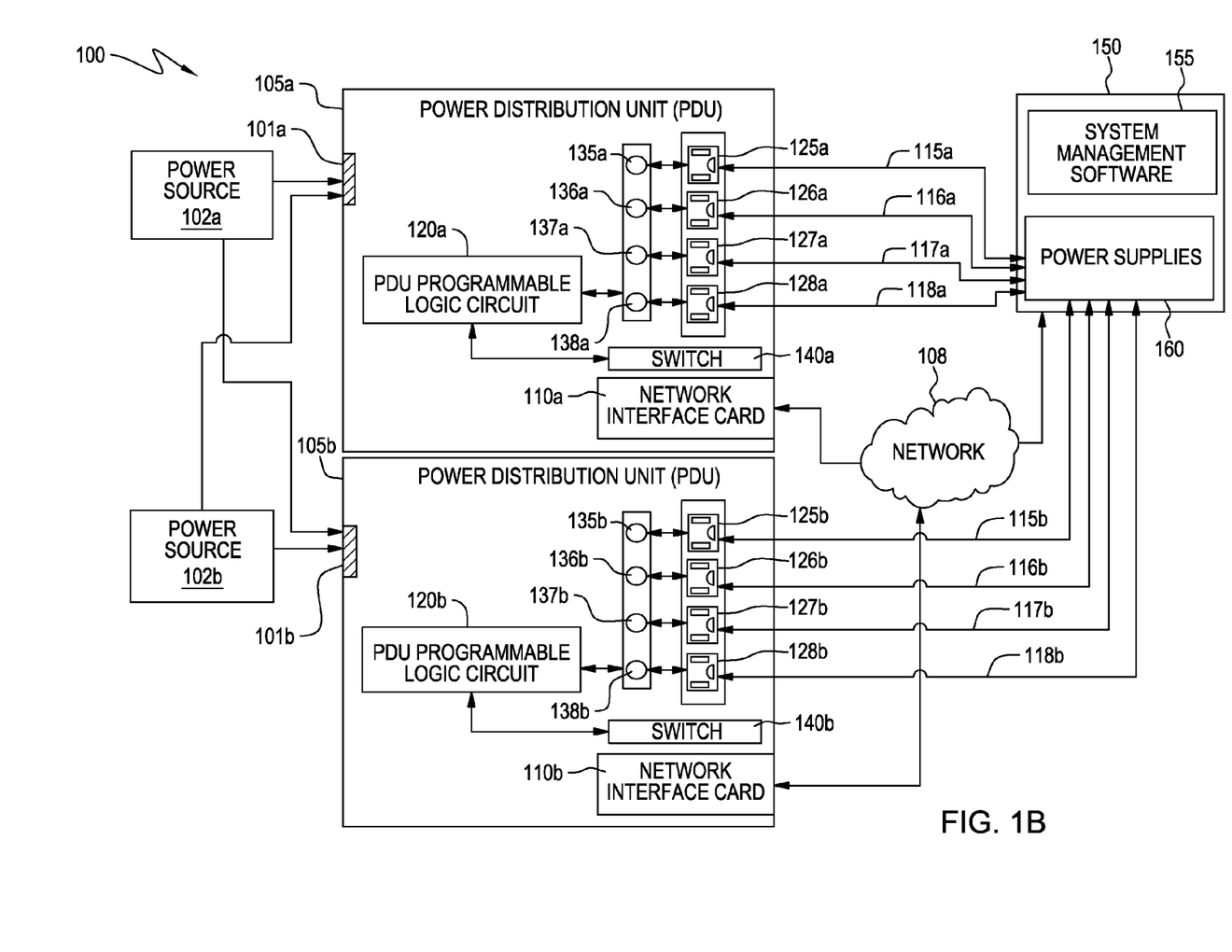
FIG. 1B is a block diagram of an alternative embodiment of the system, shown in FIG. 1A, having programmable logic circuit that modifies an illumination state of LEDs that are dedicated to specific outlets of a PDU in which each PDU has more than one power source according to an embodiment of the present invention.

FIG. 1B is a block diagram illustrating an alternative embodiment of system 100 that includes PDU 105a and 105b having power source 102a and 102b at each input 101a and 101b. In the alternative embodiment, each of hardware devices 150 can have power source redundancy by utilizing either PDU 105a alone or PDU 105b alone, because input 101a and 101b are each connected to power source 102a and 102b such that PDU 105a and 105b can each distribute electrical power from power source 102a and 102b. Thus, in the alternative embodiment, PDU 105a can provide power source redundancy for hardware devices 150 by utilizing switch 140a to select the first value that can be assigned to a portion of outlets 125a-128a connected to power source 102a, and select the second value that can be assigned to a portion of outlets 125a-128a connected to power source 102b. Similarly, PDU 105b can provide power source redundancy by utilizing switch 140b to select the first value that can be assigned to a portion of outlets 125b-128b connected to power source 102a, and select the second value that can be assigned to a portion of outlets 125b-128b connected to power source 102b. As described above the first value represents power source 102a, and the second value represents power source 102b. Moreover, in the alternative embodiment, PDU 105a and 105b each have four outlets 125a-128a and 125b-128b, respectively. In other embodiments (not shown) PDU 105a and 105b may each have only two outlets or as many as forty outlets, wherein each outlet can have its own corresponding LED.

Figure 2A:
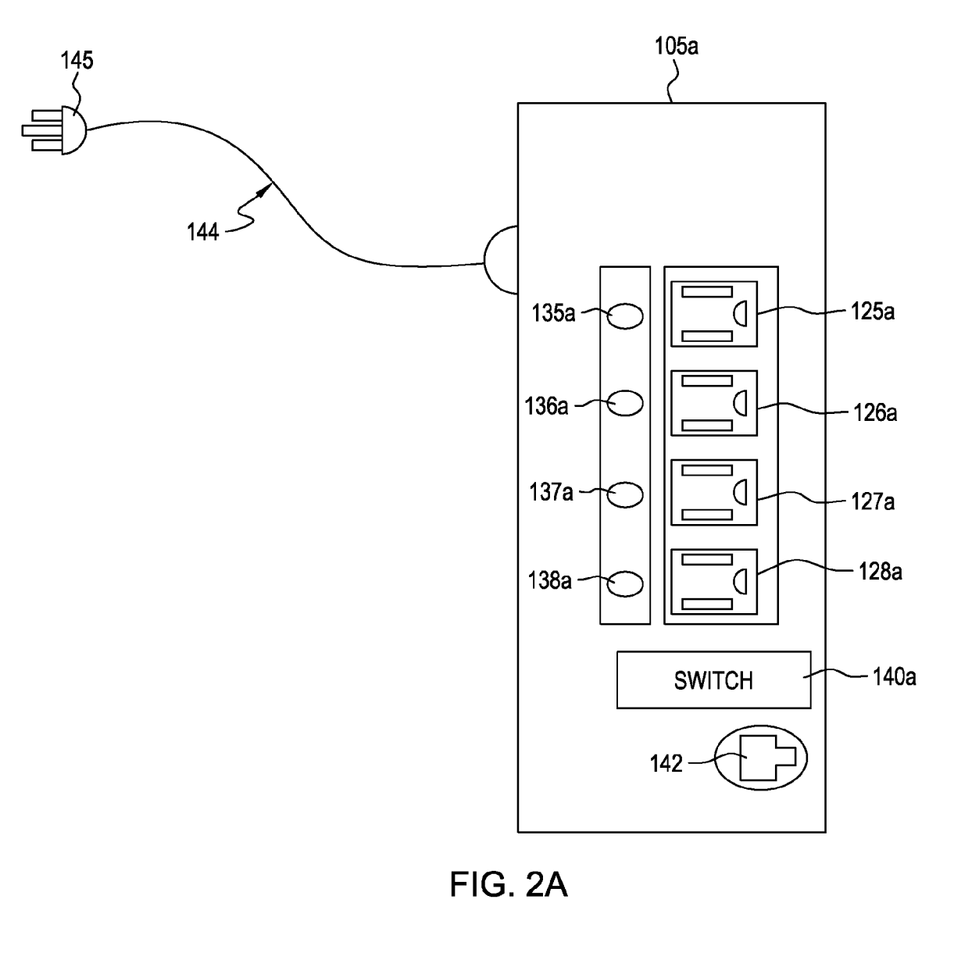
FIG. 2A is an illustration of a PDU, shown in FIG. 1A, that receives electrical power from a single power source, and receives information on power supplies and power source conditions via a data communication port according to an embodiment of the present invention.

FIG. 2A illustrates PDU 105a, shown in FIG. 1A, having outlets 125a-128a, LEDs 135a-138a, switch 140a, data communication port 142, and power cord 144 with plug 145. PDU 105a can receive electrical power from a single power source (e.g., power source 102a) via power cord 144 and can distribute the electrical power through outlets 125a-128a to hardware devices 150. In addition, PDU 105a can receive information about power supplies 160 and power source conditions through data communication port 142, wherein programmable logic circuit 120a can process the information and activate, deactivate, or blink one or more LEDs 135a-138a based on the information.

Figure 2B:
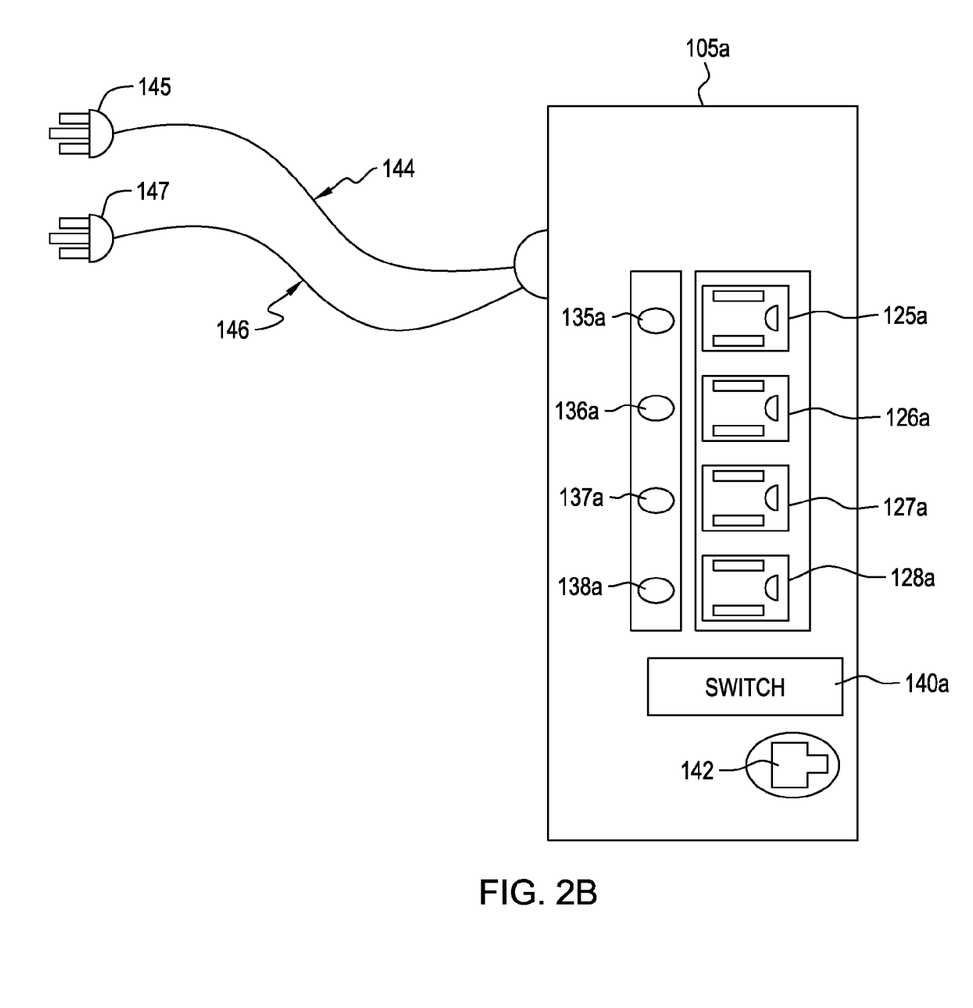
FIG. 2B is an illustration of a PDU, shown in FIG. 1B, that receives electrical power from more than one power source, and receives information on power supplies and power source conditions via a data communication port according to an embodiment of the present invention.

FIG. 2B illustrates PDU 105a, shown in FIG. 1B, having outlets 125a-128a, LEDs 135a-138a, switch 140a, data communication port 142, power cord 144 with plug 145, and power cord 146 with plug 147. PDU 105a can receive electrical power from two power sources (e.g., power source 102a and 102b) via power cord 144 and 146 and can distribute the electrical power through outlets 125a-128a to hardware devices 150. In addition, PDU 105a can receive information about power supplies 160 and power source conditions through data communication port 142, wherein programmable logic circuit 120a can process the information and activate, deactivate, or blink one or more LEDs 135a-138a based on the information.

Figure 3:
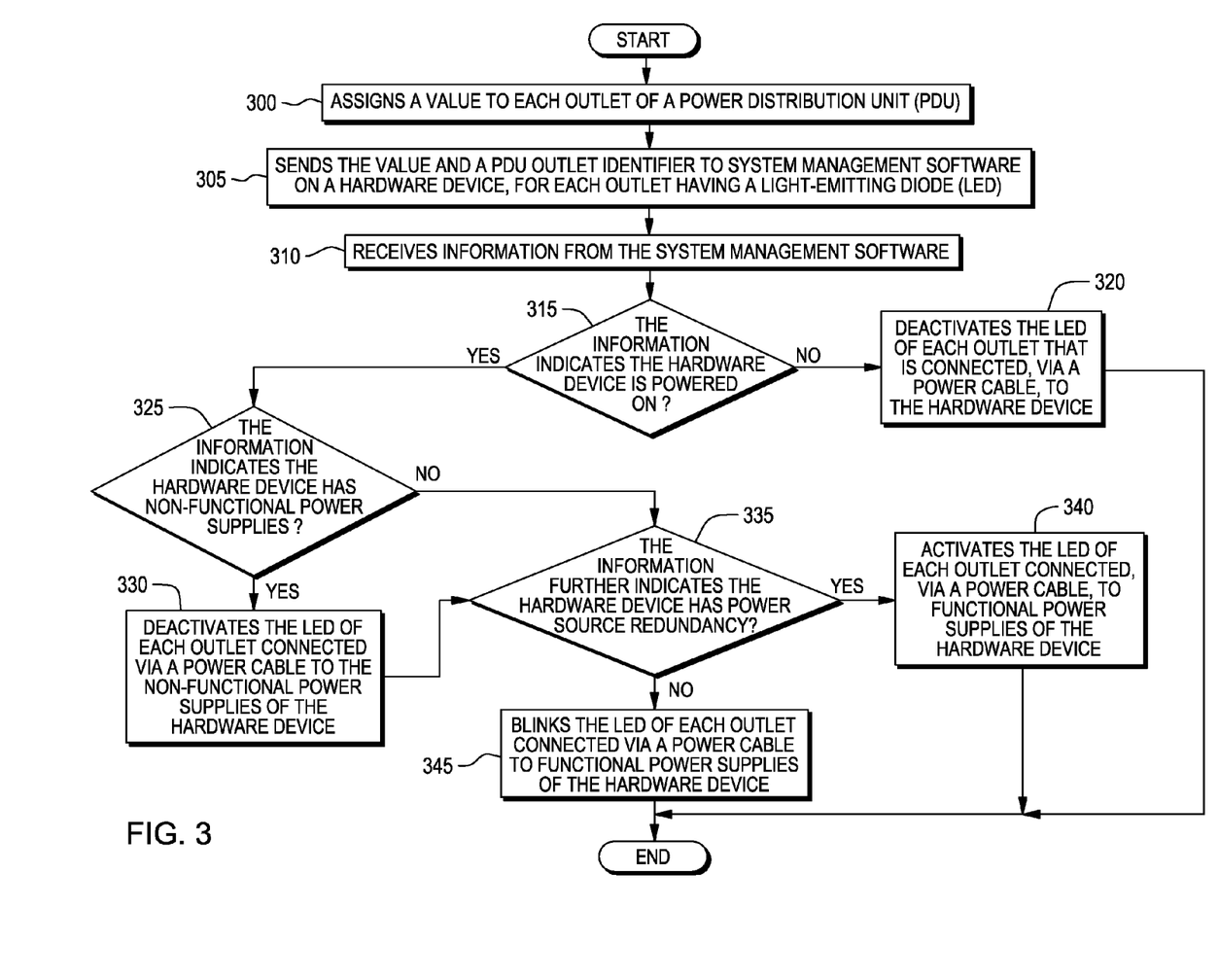
FIG. 3 is a flowchart illustrating operations of the programmable logic circuit within the PDU according to an embodiment of the present invention.

FIG. 3 is a flowchart 300 illustrating operations of programmable logic circuit 120a and 120b within PDU 105a and 105b, respectively. However, for simplicity the flowchart is explained in terms of programmable logic circuit 120a. To begin the operations, values are selected for outlets 125a-128a by utilizing switch 140a, wherein the values represent power sources at input 101a of PDU 105a. Programmable logic circuit 120a assigns a value to each outlet 125a-128a of PDU 105a (block 300). Next, programmable logic circuit 120a sends the value and a PDU outlet ID to system management software 155 on hardware devices 150, for each outlet 125a-128a having an LED (block 305). System management software 155 processes the value to determine whether the hardware device 150 has power source redundancy. Specifically, system management software 155 on a hardware device 150 can determine that hardware device 150 has power source redundancy if system management software receives at least two different values (i.e., a first value and a second value) that each have different PDU outlet IDs. Next system management software 155 sends information to programmable logic circuit 120a. The information includes the following: outlets 125a-128a and 125b-128b that are connected to hardware devices 150 via power supplies 160, whether hardware devices 150 are powered on, whether hardware devices 150 are powered off, whether hardware devices 150 are receiving electrical power via power supplies 160 from at least two different power sources, outlets 125a-128a and 125b-128b that are connected to power supplies 160 that are non-functional, and outlets 125a-128a and 125b-128b that are connected to power supplies 160 that are functional.

Programmable logic circuit 120a receives the information from system management software 155 (block 310). Next, if programmable logic circuit 120a determines that the information indicates hardware device 150 is powered off ("NO" branch of decision block 315), then programmable logic circuit 120a deactivates the LED (e.g., LED 135a-138a) of each outlet 125a-128a that is connected, via a power cable, to hardware device 150 (block 320). Subsequently, further processing by programmable logic circuit 120a ends. However, if programmable logic circuit 120a determines that the information indicates hardware device 150 is powered on ("YES" branch of decision block 315), then programmable logic circuit 120a determines if the information indicates hardware device 150 has non-functional power supplies 160.

If programmable logic circuit 120a determines that the information indicates hardware device 150 does not have non-functional power supplies 160 ("NO" branch of decision block 325), then programmable logic circuit 120a determines if the information further indicates hardware device 150 has power source redundancy. If programmable logic circuit 120a determines that the information further indicates hardware device 150 has power source redundancy ("YES" branch of decision block 335), then programmable logic circuit 120a activates the LED (e.g., LED 135a-138a) of each outlet 125a-128a connected, via a power cable, to functional power supplies 160 of hardware device 150 (block 340). Subsequently, further processing by programmable logic circuit 120a ends.

However, if programmable logic circuit 120a determines that the information indicates hardware device 150 has non-functional power supplies 160 ("YES" branch of decision block 325), then programmable logic circuit 120a deactivates the LED (e.g., LED 135a-138a) of each outlet 125a-128a connected, via a power cable, to non-functional power supplies 160 of hardware device 150 (block 330). Subsequently, if programmable logic circuit 120a determines that the information indicates hardware device 150 has power source redundancy ("YES" branch of decision block 335), then programmable logic circuit 120a activates the LED (e.g., LED 135a-138a) of each outlet 125a-128a connected, via a power cable, to functional power supplies 160 of hardware device 150 (block 340). However, if programmable logic circuit 120a determines that the information indicates hardware device 150 does not have power source redundancy ("NO" branch of decision block 335), then programmable logic circuit 120a blinks the LED (e.g., LED 135a-138a) of each outlet connected via a power cable to functional power supplies 160 of hardware device 150 (block 345). Next, further processing by programmable logic circuit 120a ends.

Flowchart 300 depicted in FIG. 3 illustrates the functionality and operation of possible implementations of a programmable logic circuit within a PDU having outlets in which each outlet has an LED, according to various embodiments of the present invention. In this regard, each block in the flowchart or block diagrams may represent a module, segment, or portion of code, which comprises one or more executable instructions for implementing logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A system comprising:
   a first power source;
   a hardware device;
   an electrical outlet;
   an indicator hardware set; and
   a programmable logic circuit;
   wherein:
   the hardware device comprises a power supply;
   the hardware device is powered by the electrical outlet;
   the power supply is disconnectably electrically connected to the electrical outlet;
   the first power source is disconnectably electrically connected to the electrical outlet;
   the electrical outlet is structured, connected and/or located so that electrical power is supplied from the first power source to the power supply through the electrical outlet;
   the electrical outlet is located in close proximity to the indicator hardware set;
   the hardware device is structured, connected and/or programmed to:
   determine an operational status information of the power supply, the operational status information is related to the status of the power supply, the operational status information including a first value; and
   generate a signal that includes the operational status information; and
   send the signal through a communication network to the programmable logic circuit; and
   the programmable logic circuit is structured, connected and/or programmed to:
   assign the first value to the electrical outlet, the first value including a first identifier identifying the electrical outlet, and a first name representing the first power source;
   send the first value to a program on the hardware device that comprises one or more power supplies and is powered by the electrical outlet;
   receive the signal, through the communication network, from the hardware device related to the status of the one, or more, power supplies coupled to the electrical outlet; and
   modify an indication status of the indicator hardware set based, at least in part, on the signal.

2. The system of claim 1 wherein the operational status information of the power supply reflects whether the power supply is in a suitable operational status to be electrically disconnected from the electrical outlet.

3. The system of claim 1 further comprising second power source, wherein the operational status information of the power supply reflects whether the hardware device is receiving electrical power from the first power source or the second power source.

\* \* \* \* \*